United States Patent [19]
Weedon et al.

[11] Patent Number: 5,138,552
[45] Date of Patent: Aug. 11, 1992

[54] DATA ACQUISITION SYSTEM USING NON-LINEAR DIGITIZATION INTERVALS

[75] Inventors: Hans J. Weedon, Salem; Enrico Dolazza, Boston, both of Mass.

[73] Assignee: Analogic Corporation, Peabody, Mass.

[21] Appl. No.: 333,103

[22] Filed: Apr. 4, 1989

[51] Int. Cl.$^5$ .............................................. G06F 15/42
[52] U.S. Cl. ............................................... 364/413.05
[58] Field of Search ........................... 364/413.5, 574; 328/128

[56] References Cited

U.S. PATENT DOCUMENTS

4,163,947  8/1979  Weedon ............................. 328/128
4,569,028  2/1986  Dolazza et al. ..................... 364/574

Primary Examiner—Gail O. Hayes
Attorney, Agent, or Firm—Toby H. Kusmer

[57] ABSTRACT

A data acquisition system is described for converting a plurality of analog information signals to a corresponding plurality of digital output signals each (a) having a dynamic range of n bits to match the dynamic range of the corresponding analog information signal, and (b) representative of the corresponding analog information signal during each of a plurality of time intervals. The system simultaneously converts each of the analog signals to an intermediate digital signal during each of the time intervals in accordance with a digitization code of m bits (where m is less than n) such that the digitization intervals of the code increase non-linearly so that the ratio of the noise level of the intermediate digital signal and the digitization interval of the code is substantially constant throughout the dynamic range of the analog signals. The intermediate digital signals are transformed to the corresponding digital output signals.

12 Claims, 6 Drawing Sheets

A  CW X-RAYS

B  CHARGE

C  CHARGE XFER

D  CONVERSION TIME

E  READ OUT & DATA PROC.

Fig. 7

DATA ACQUISITION SYSTEM USING NON-LINEAR DIGITIZATION INTERVALS

BACKGROUND OF THE INVENTION

The present invention relates generally to a data acquisition system, and more particularly to an improved data acquisition system for use in simultaneously converting a plurality of related analog information signals to corresponding digital signals.

Various signal processing techniques involve the simultaneous detection of a plurality of analog information signals for the purpose of acquiring data represented by the signals. For example, certain commercially-available medical imaging systems, such as C.T. scan systems, are used to image internal features of an object under view by exposing the object to a preselected amount and type of radiation. Detectors sense radiation from the object and generate analog signals representative of internal features of the object.

In the example of a C.T. scan system, the X-ray source and detectors are rotated in a plane, relative to an object, through a series or sets of views or readings so that the system can acquire data representative of two-dimensional spatial information of a cross-sectional "slice" of the object lying in the plane of rotation of the source and detectors. These C.T. scan systems each utilize a source of X-ray photons. The source may provide periodic X-ray pulses, or alternatively, continuous-wave (CW) X-rays. The detectors, usually in the form of gas or solid state detectors, are disposed relative to the source so as to define a corresponding plurality of X-ray paths for each set of readings. When the object is exposed to the X-ray source, the number of photons absorbed along the various paths through the object, during each sampling period defining each view or reading, is a function of the absorption characteristics of the portions of the object along each path. The detectors generate a corresponding plurality of analog signals representative of X-ray flux detected during each sampling period.

While the signals generated by the detectors through the series of readings provide the required data to generate the 2-dimensional image, acquiring and processing the data can pose various design problems. For example, a large number of detectors must be used for each set of readings made during each sampling period in order to create a detailed image with sufficient resolution (a typical C.T. scan system contains of the order of 500 detectors, although the number can clearly vary). In order to improve the resolution of the image created, the number of detectors used and/or the number sets of readings must be increased. However, the greater the number of detectors and/or sets of readings utilized, the greater the amount of data acquired and the greater amount of signal information that must be processed. Accordingly, the analog signals acquired in each set of readings or views must be quickly and efficiently digitized so that computer processing can be utilized to provide relatively fast results.

Various problems exist with respect to current analog to digital (A/D) conversion techniques for digitally converting a large number of simulataneously created analog signals, such as those created in a C.T. scan system. For example, one such technique involves dividing the channels, through which the corresponding analog signals are transmitted, into groups, with the channels of each group time sharing an A/D converter. Thus, the analog signals associated with each group are applied to the common A/D converter in a sequential manner so that all of the analog signals transmitted through the channels of a group can be independently converted by the common A/D converter. Frequently, the signal conversion is not identical for each of the signals to the degree necessary to achieve the desired high resolution for a relatively large dynamic range (the latter being of the order of $10^6$ to 1). The variabilities among the A/D converters can result in nonuniform readings.

Where such a device is used with a continuous X-ray source, any modulation in the X-ray source over time will create errors since the channels are not all converted simultaneously. The approach described also encounters problems when used with a pulse X-ray source. For example, artifacts due to variable afterglow readings of X-ray pulses are not necessarily treated identically for all of the channels. These interpulse values have an overall effect on the values of the detected analog signals corresponding to the detected X-rays in response to the pulses of X-rays from the source, and the interpulse values should be taken into consideration to provide accurate readings. In addition current leakage of certain storage devices, disposed in each channel, that temporarily store information can create errors in the signal conversion. While some of these problems could be overcome by using a separate A/D converter for each channel, such an approach is impractical because of its prohibitive costs. With the dynamic range of the analog signals provided in each channel of the order of $10^6$ to 1 a linear ramp A/D converter is also impractical Many other A/D converter techniques, such as successive approximate A/D conversion, are known, but each is considered to have one or more drawbacks, including inadequate signal resolution and therefore incapable of achieving a digital signal of 20 bits or more.

OBJECTS AND SUMMARY OF THE INVENTION

Accordingly, it is a general object of the present invention to provide an improved data acquisition system which overcomes or substantially reduces the above-noted problems.

A more specific object of the present invention is to provide an adaptive digitizing data acquisition system which utilizes a minimum number of bits required to properly code the informational content of the signal, while preserving the desired dynamic range for representing image information.

Another, more specific object of the present invention is to provide a data acquisition system for simultaneously and synchronously converting a plurality of analog signals to digital signals during each reading so as to reduce the number of uniformity and design constraints of multiple A/D converter systems in which several A/D converters operate independently.

It is another specific object of the present invention to provide an improved data acquisition system for converting analog signals acquired from either continuous wave or pulsed X-ray sources.

It is yet another specific object of the present invention to provide an improved data acquisition system for converting analog information signals to digital signals each having a dynamic range of the order of 20 bits or more.

And still another specific object of the present invention is to provide an improved A/D converter system, for use in a pulsed X-ray C.T. scan system, for simultaneously converting all of the analog signals of the corresponding channels to a digital code so as to provide uniformity of readings substantially insensitive to certain types of artifacts.

And yet another object of the present invention is to provide an improved A/D converter system capable of decreasing certain electronic noise by decreasing the operational frequencies of the system.

And still another object of the present invention is to provide an improved A/D converter system which can easily be adapted for use with both pulse and CW X-ray sources.

And yet another object of the present invention is to provide an improved A/D converter system for use in a C.T. scan system with pulsed X-ray sources capable of taking into consideration the interpulse levels of the analog signals.

These and other objects are achieved by an improved data acquisition system for converting a plurality of analog information signals to a corresponding plurality of digital output signals, each (a) having a dynamic range of n bits to match the dynamic range of the corresponding analog information signal, and (b) representative of the corresponding analog information signal during each of a plurality of time intervals. In accordance with one aspect of the invention the system comprises:

means for simultaneously converting each of the analog signals to an intermediate digital signal during each of the time intervals in accordance with a digitization code of m bits, wherein m is less that n, such that the digitization intervals of the code increase non-linearly so that the ratio of the noise level of the intermediate digital signal and the digitization interval of the code is substantially constant throughout the dynamic range of the analog signals; and means for transforming each of the intermediate signals to a corresponding value of the digital output signals.

In accordance with another aspect of the present invention, the system comprises:

signal averaging means for averaging each of the analog signals during each of said time intervals so as to produce a corresponding average signal representative of the average value of the analog signal during each such time interval;

signal generating means for generating a comparison signal during a signal comparison period of time during each of the time intervals, wherein the comparison period includes a plurality of clocking intervals equal to the number of unique digitization intervals of a predetermined digitization code, and the comparison signal varies with time during each signal comparison period so that the values of the comparison signal at the ends of the corresponding comparison intervals throughout the comparison period (i) vary as a nonlinear function of time and (ii) represent the possible number of digitization intervals of said digitization code;

signal comparison means, coupled to the output of the signal averaging means and the signal generation means, for synchronously comparing each of the average signals with the comparison signal at the end of each of the comparison intervals during the comparison period; and means, responsive to said signal comparison means, for providing a plurality of encoded digital signals respectively representative of the number of clocking intervals the value of each integrated signal exceeds the comparison signal during the comparison period, wherein each of the encoded digital signals digitally represents the corresponding value of an integrated signal in accordance with said digitization code;

wherein the ratio of the noise level of the encoded digital signal and the digitization interval is substantially constant throughout the dynamic range of the encoded digital signal.

In accordance with another aspect of the present invention, an analog to digital converter for converting an analog signal to a digital signal during each of a plurality of predetermined conversion intervals of time. The converter comprises:

integrating means for integrating the analog signal during each conversion interval of time so as to provide an integrated signal;

signal generation means for generating a comparison signal having a value that varies as a function of the square of time during a comparison period of time for each of said conversion intervals of time;

signal comparison means, coupled to the output of said integrating means, for comparing the value of said integrated signal with the value of said comparison signal for each of a plurality of clocking intervals during said comparison period; and means, responsive to said signal comparison means, for generating said digital signal for each said conversion interval as a function of the number of clocking intervals the value of said analog signal exceeds said comparison signal during said comparison period.

Other objects of the present invention will in part be obvious and will in part appear hereinafter. The invention accordingly comprises the apparatus possessing the construction, combination of elements, and arrangement of parts exemplified in the following detailed disclosure, and the scope of the application of which will be indicated in the claims.

BRIEF DESCRIPTION OF THE DRAWINGS

For a fuller understanding of the nature and objects of the present invention, reference should be had to the following detailed description taken in connection with the accompanying drawings wherein:

FIGS. 6A–6H is a timing diagram for illustrating the operation of the preferred embodiment illustrated in FIGS. 1–4; and FIGS. 7A–7E is a timing diagram for illustrating the operation of the preferred embodiment modified for use with a CW C.T. scan system.

DETAILED DESCRIPTION OF THE DRAWINGS

The same numerals are used in the drawings to designate the same or like parts, with the like parts being identified with the same reference numerals accompanied by lower case letters.

Figure 1:
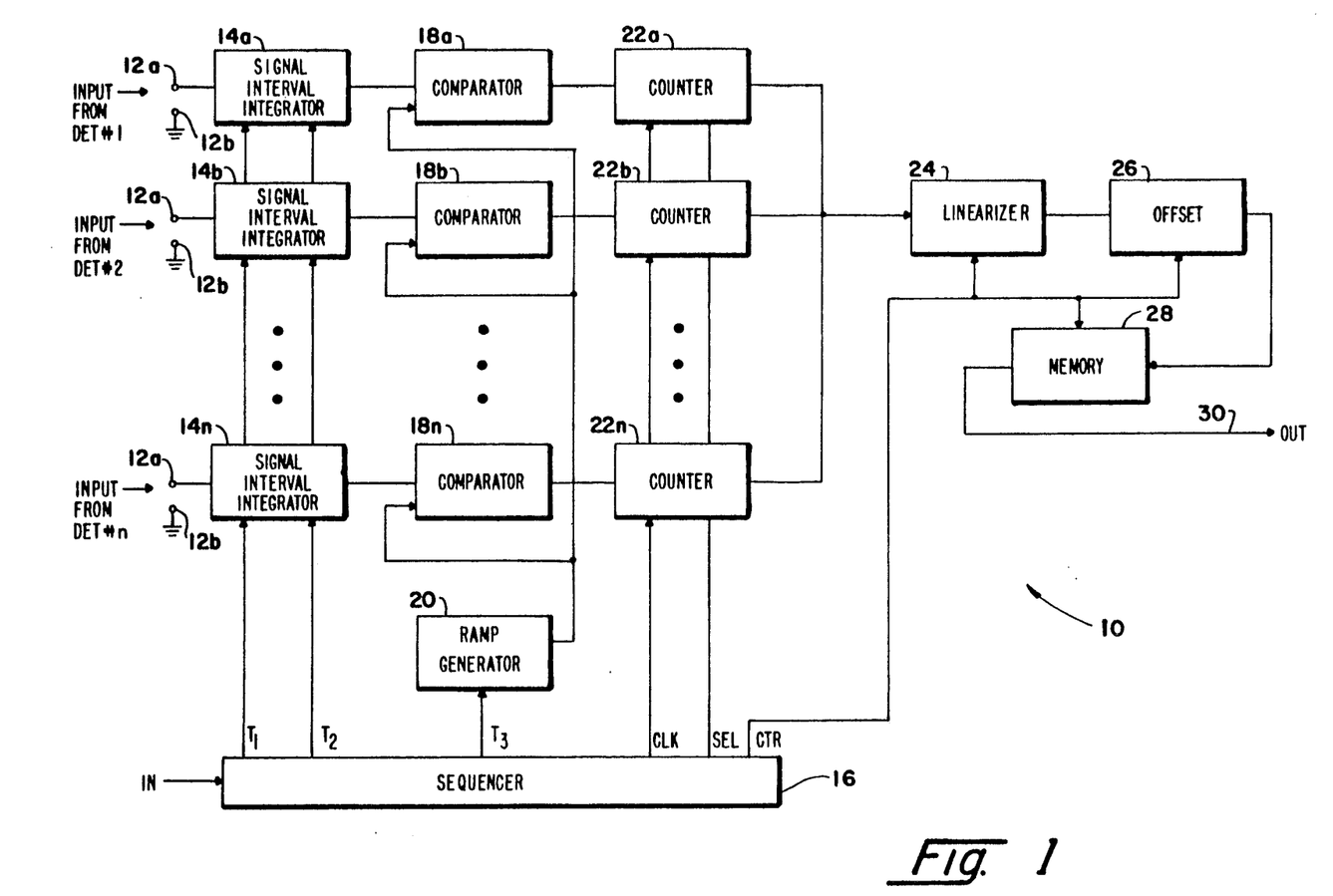
FIG. 1 is a block diagram of the preferred embodiment of the present invention adapted for use in pulse X-ray C.T. scan systems.

In FIG. 1, the data acquisition system 10 includes a plurality of information transmission channels, one for each of the analog information signals received by the system. In the preferred embodiment, the system is designed to be used in a C.T. scan system for converting a plurality of analog currents received from respective detectors of the system (not shown), the currents being representative of the number of X-ray photons sensed by the respective detectors. Each information transmission channel includes a pair of input terminals 12a and 12b for receiving the analog signal. Each pair of input terminals 12a and 12b form the input of a signal interval integration circuit 14 for periodically averaging the input signal and temporarily holding the averaged signal for further processing. The circuit 14 is controlled by the timing circuit or sequencer 16. The latter responds to an input signal provided so as to indicate the beginning of an integration period and provides timing signals for operating the system in its proper sequence. In a pulsed X-ray C.T. scan system, the input signal to the sequencer may be provided, for example, in response to the signal used to time the exposure of the object to the X-ray source for each pulse of X-rays. In any event, the sequencer is used to define each integration period that the input signal is collected. The value of the average signal for the integrating period is provided at the output of each circuit 14 and applied to one input of a corresponding comparator 18. The other input of each comparator is connected to receive the output of a comparison or reference signal provided from ramp generator 20.

Each comparator 18 provides a logic "1" or high output so long as the amplitude output from the signal interval integration circuit exceeds the amplitude of the reference signal and provides a logic "0" or low output so long as the amplitude output from the circuit 14 is equal or is less than the reference signal.

Figure 4:
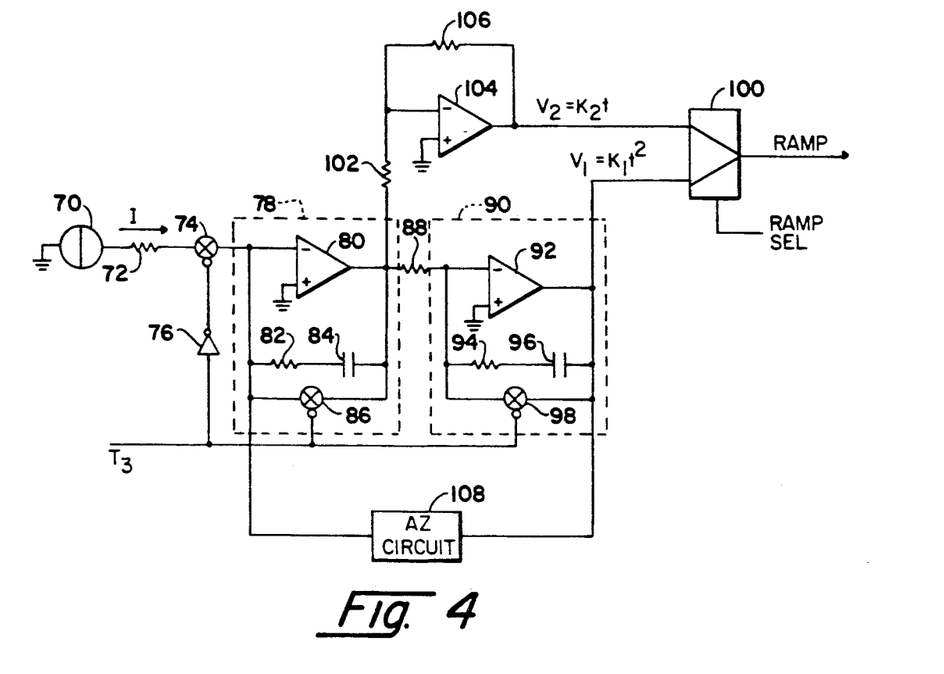
FIG. 4 is a partial schematic and partial block diagram of the ramp generator used in the preferred embodiment of the present invention.

Ramp generator 20, described in greater detail hereinafter with respect to FIG. 4, is preferably designed to provide a reference signal having an amplitude which ramps between zero to a maximum value over a predetermined period of time, referred to hereinafter as the "comparison period". The specific maximum value is defined by the linear dynamic range of analog input signal so that zero and the maximum values represent the smallest and largest possible amplitudes of the input signals. In accordance with one aspect of the present invention, the amplitude of the reference signal varies non-linearly with time. Preferably, for reasons which will be more apparent hereinafter, during the comparison period the amplitude of the reference signal varies as a function of the square of the lapsed time during the comparison period, as indicated by the following equation (1):

$$V = k_1 t^2 \qquad (1)$$

wherein V is the voltage of the reference signal,
$k_1$ is a constant; and
t is the lapsed time during the comparison period.

When the system is used with pulsed X-ray sources, the generator 20 also provides a ramp signal having an amplitude which varies as a linear function of time during a comparison period as defined by the following equation (2):

$$V = k_2 t \qquad (2)$$

where $k_2$ is a constant; and
t is the lapsed time during the comparison period.

As described in greater detail hereinafter, the linearly varying ramp signal is used for the purpose of generating a digital signal representative of the interpulse value of the analog signals provided between X-ray pulses as will be described in greater detail hereinafter.

The output of each comparator 18 is connected to the input of a counter 22. Each counter receives from the sequencer 16 a clocking signal at periodic intervals during the comparison period. Upon the receipt of each pulse of the clocking signal during the comparison period, the counter will increment by one if the output of the corresponding comparator is high at that moment, and will retain the previously determined count if the output of the corresponding comparator is low at that moment. The counter therefore accumulates a count of the number of times the output of the corresponding comparator is high when the pulses of the clocking signal are applied to the counter during the comparison period. Thus, at the end of the comparison period the count in each counter will represent the number of times during the comparison period that the comparator output exceeds the reference signal, and thus represent the digitized value of the average signal of the analog signal provided during the conversion period of time provided from the corresponding circuit 14 just prior to the commencement of the comparison period.

The rate of the clocking signal is such that the number of times each counter is clocked during a comparison period will equal the number of codes (i.e., possible digital values) used to represent the entire linear dynamic range of the analog signals. In the preferred embodiment, 16384 ($2^{14}$) different codes are used to represent the analog signal so that the counter will be clocked 16384 times during each comparison period. Each comparison period is preferably about 1 millisecond, so that the rate of the clocking signal is set at about 20 MHz.

With the reference signal from the ramp generator 20 increasing in a nonlinear fashion as defined by equation (1) above, the digitization interval increases non-linearly with each clocking pulse during the comparison period, at a rate proportional to the square root of the amplitude of the reference signal. It is generally known that the noise level of X-ray flux is proportional to the square root of the number of photons present. Thus, the noise level of the analog signal provided in each information transmission channel is proportional to the square root of the amplitude of the analog signal. By varying the reference signal in accordance with equation (1) during the comparison period, the ratio of the noise level of the digital signal and the digitization interval will be substantially constant throughout the dynamic range of the digital signal, consistent with the teachings of U.S. Pat. No. 4,569,028 issued to Enrico Dolazza, Bernard M. Gordon and Hans J. Weedon, and assigned to the present assignee. As a consequence, the number of bits required to properly code the information content of each analog signal is minimized, while the desired dynamic range for representing the image information is preserved as taught in that patent.

Each counter 22 also receives a select signal from the sequencer 16 so that the counters can be sequentially read after the comparison period. The output of each counter 22 is connected to the input of a linearizer 24 for linearizing the output count of each counter. The linearizer 24 can include a look-up table for each code wherein the linear value corresponding to each possible count can be listed and made available at the output of the linearizer. In the preferred embodiment, however, where the digitization interval is proportional to the square root of the amplitude of the analog signal, the linearizer can alternatively include a signal squarer (i.e., a signal multiplier in which the input signal is multiplied by itself).

As described the system 10 is adapted for use in acquiring data in a pulsed X-ray C.T. scan system. Accordingly, system 10 preferably includes offset means 26 for subtracting from the output of the linearizer 24 the value of the analog signal between X-ray pulses (preferably an average accumulated value), representative of the amount of leakage current during the time periods between consecutive X-ray pulses. The offset means 26 is eliminated (i.e., made ineffective) when the system is used with continuous X-ray sources, as described hereinafter. The output of the offset means 26 is applied to the memory 28 for storing the data for subsequent retrieval and/or processing. The output of memory 28 is applied directly to the output 30.

As shown, the operation of the linearizer 24, offset means 26 and memory 28 can be controlled by corresponding control signals provided by sequencer 16.

Still referring to FIG. 1, in operation, when the object being imaged is exposed to each periodic pulse of X-rays from the source of X-rays, the sequencer 16 is programmed to simultaneously provide signals $T_1$ and $T_2$ to all of the signal interval intergrator circuits 14 so that each circuit integrates the input current applied to input terminals 12 during each integrating interval so as to provide a signal representative of the average value of each analog signal provided at the corresponding input terminals 12 during each such interval. The integrated or average signal collected during this finite period of time is applied to the input of the comparator 18. The comparison period is started by the signal $T_3$ so that the reference signal begins ramping from zero to its maximum value in accordance with equation (1), above. As the reference signal increases, the counter is clocked by the clocking signal from sequencer 16 so that the output of the comparator can be counted at each clocking interval. In the example given above, where 16384 clocking pulses are provided during the comparison period, at the end of the comparison period the counter will contain a signal representative of the number of times during the comparison period that the output of the comparator is high of the total 16384 times the counter is clocked. This number therefore will represent the digitally coded value corresponding to the average value provided by the circuit 14 during the comparison period, and as encoded by the nonlinear function of the reference signal. At the end of the comparison period the output of each of the counters is a non-linearized digitized signal and can be sequentially provided to the linearizer, where each signal is linearized. The offset value is subtracted from each signal value and the data is stored, or read out at output 30.

The offset value is determined during the previous time period between X-ray pulses, which preferably is an average accumulated value. As will be more evident hereinafter, during the interpulse period, each analog signal representative of the interpulse value detected, is averaged for the integrating period of time. The integrated signal is then applied to the input of the corresponding comparator 18. The ramp generator 20 then generates a linearly varying signal in accordance with equation (2) above. The linearly varying ramp signal is preferred since the dynamic range of the interpulse value will always be much smaller than the values of the pulses, and a linear ramping signal between zero and the maximum expected interpulse value can be easily generated within the interpulse period. In this way the digitization of the interpulse value between two successive pulses will be much more accurate and converted at a relatively high resolution. The digital value of the interpulse portion of the signal is then preferably averaged with previously obtained values and subtracted from the next digital signal generated for the next pulse by the offset means 26. By deriving a digital value for each interpulse, averaging the accumulated values and subtracting the averaged interpulse value from the next pulse, an accurate true value of each pulse is derived even if the signal levels during the interpulse periods tend to drift over time. As previously mentioned the system can easily be converted for use with a CW C.T. scan system by setting the offset means so that a signal appearing at its input will appear at its output and thus making the offset means ineffective. The advantages of the present invention will become more apparent from the following more detailed description of the preferred embodiment of the present invention.

Figure 2:
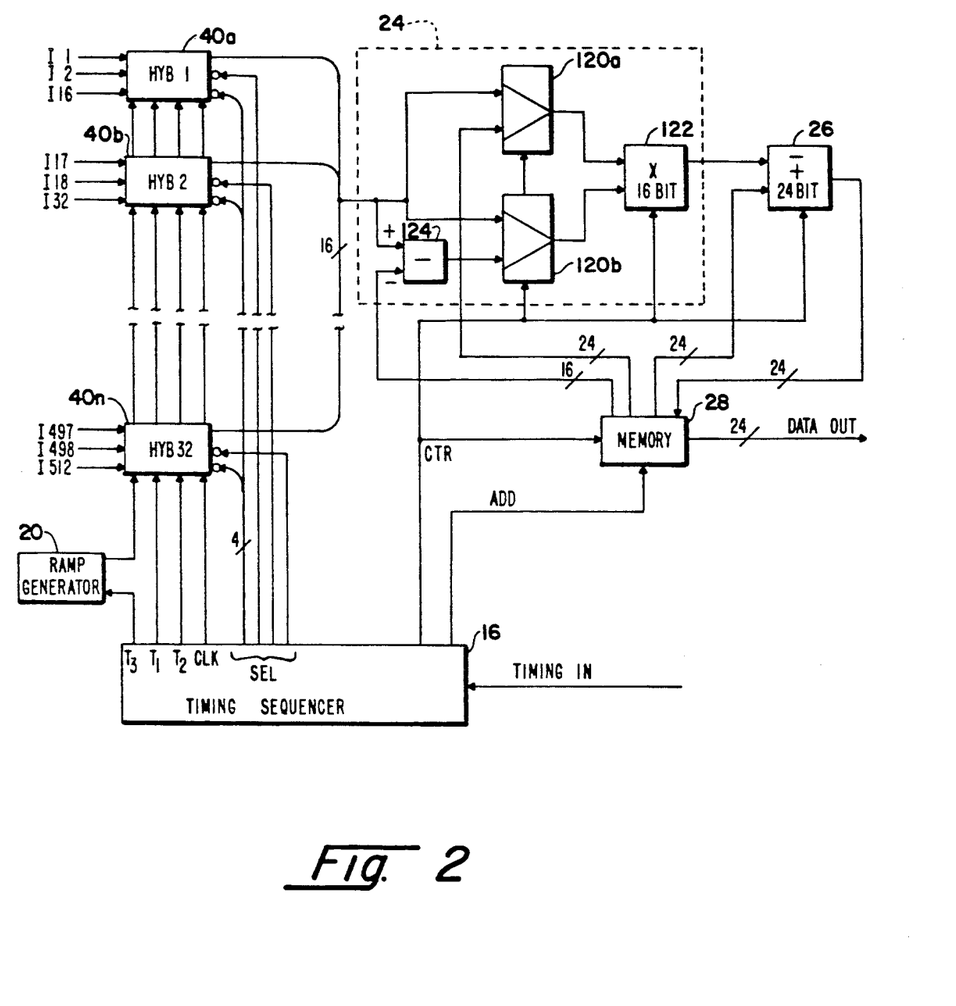
FIG. 2 is a more detailed block diagram of the preferred embodiment of the present invention.

Referring to FIG. 2, the preferred data acquisition system 10 generally includes at least one, and preferably a plurality of hybrid circuits 40 so that certain components can be manufactured at relatively low cost. Each hybrid circuit 40 preferably includes a plurality of information transmission channels. For example, as shown each hybrid circuit includes sixteen information transmission channels for receiving sixteen different analog signals from sixteen detector elements. Sequential transmission of signals from the hybrid circuits is controlled by the sequencer 16 by the select signals. Each hybrid circuit includes a signal interval integrator circuit 14 for each information transmission channel.

Figure 3:
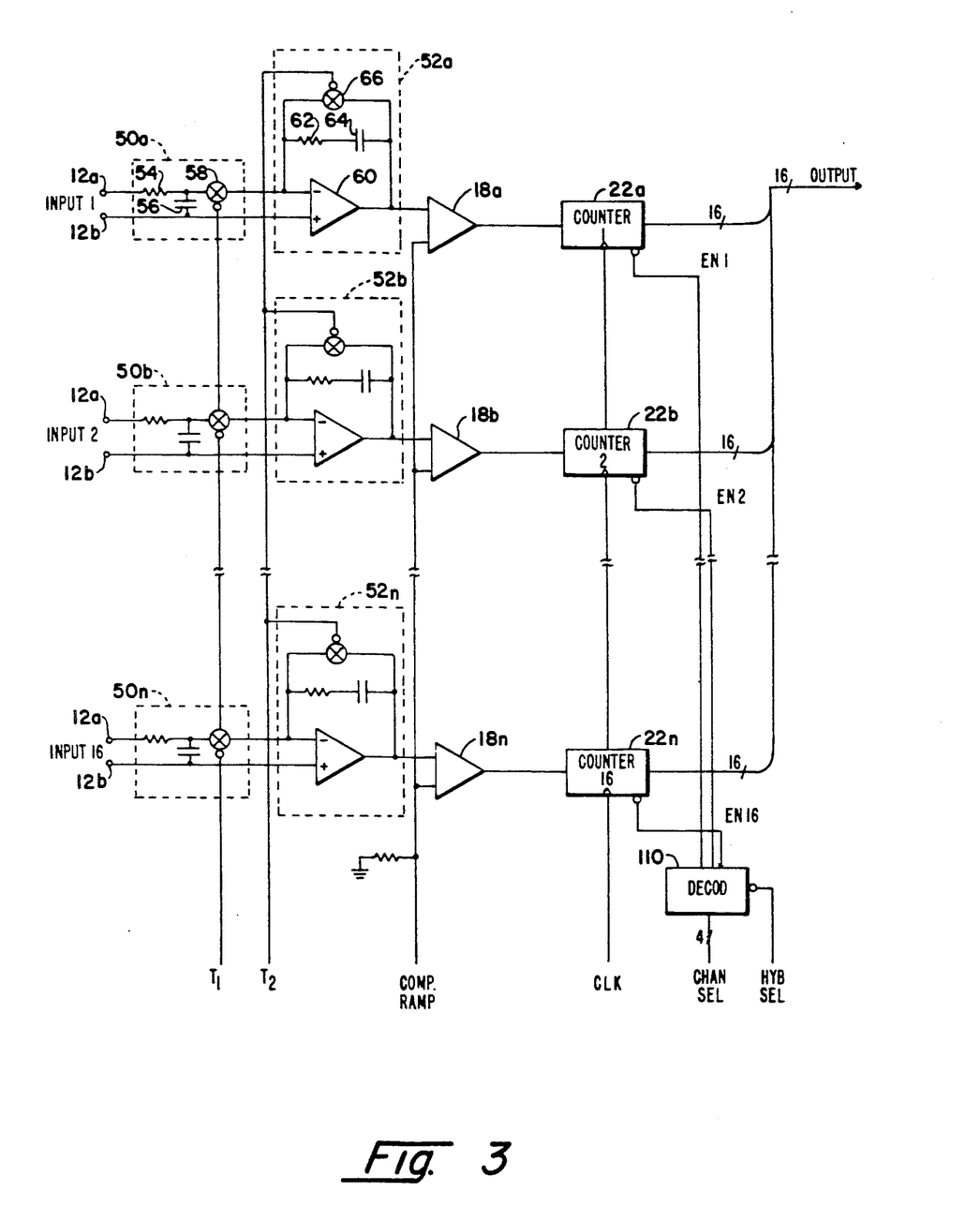
FIG. 3 is a partial schematic and partial block diagram of the preferred hybrid portion of the embodiment shown in FIG. 2 for simultaneously converting a plurality of analog signals to digital form.

As shown in FIG. 3, the preferred circuit 14 of each channel includes a charge to voltage (Q/V) converter comprising a charge collection circuit 50 for collecting charge as a function of the value of the signal applied to the input terminals 12 of the channel, and a charge transfer and hold circuit 52 for transferring the charge provided by the circuit 50 and converting the charge into a voltage proportional to the charge. More specifically, each circuit 50 includes resistor 54 connected at one end to the terminal 12a, and at its other end to the plate of charge capacitor 56 and to the signal controllable switch 58, the latter in turn being connected to the inverting input of the operational amplifier 60 of the circuit 52. The opposite plate of charge capacitor 56 is connected to the terminal 12b and to the non-inverting input of the amplifier 60 and thus forms system ground. Switch 58 is responsive to the timing signal $T_1$ provided by sequencer 16 (shown in FIG. 2), and is used to control the discharging of the capacitor 56. Switch 58 may be, for example, a field effect transistor (FET), or the like. When switch 58 is opened, the charge on capacitor 56 will be a function of the input current flowing through the input terminals 12a and 12b during the integrating interval. When the switch is closed the charge on capacitor 56 will be transferred to the inverting input of operational amplifier 60.

The amplifier 60 of the circuit 52 has its inverting input connected through the feedback resistor 62 to one plate of the charging capacitor 64, with the other plate of the capacitor being connected to the output of the amplifier. A second signal controllable switch 66 is connected in parallel with the resistor 62 and capacitor 64 and is controlled by the timing signal $T_2$ supplied by the sequencer 16. When switch 66 is closed, the capacitor 64 is discharged of previous charge through resistor 62 and the amplifier 60 is reset. The output of the amplifier 60 is connected to one input of comparator 18, with the other input of the comparator being connected to receive the reference signal from ramp generator 20, shown in FIG. 2, and described in greater detail with respect to FIG. 4.

Referring to FIG. 4, the preferred ramp generator 20 includes an input current source comprising the voltage generator 70 and the resistor 72. Resistor 72 is connected to a signal controllable switch 74. The operating mode of the switch 74 is controlled by the inverse of the control signal $T_3$ provided from sequencer 16. Accordingly, inverter 76 is connected to receive the control signal $T_3$ from the sequencer 16, and provide a signal to the control input of the switch that is the inverse of $T_3$. Switch 74 is connected to the inverting input of the operational integrator 78. Operational integrator 78 includes inverting amplifier 80, having its non-inverting input connected to system ground, and its inverting input connected to the switch 74 and the feedback resistor 82. The latter, in turn, is connected to one plate of feedback capacitor 84. The other plate of the capacitor 84 is connected to the output of the amplifier 80. A signal controllable switch 86 is connected in parallel with the resistor 82 and capacitor 84 between the inverting input and output of the amplifier. Switch 86 is controlled by the control signal $T_3$, and when closed helps to reset the amplifier 80.

The output of the amplifier 80 is connected through resistor 88 to the inverting input of an operational amplifier 92 of a second operational integrator 90. The inverting input of amplifier 92 is connected to the feedback resistor 94, which in turn is connected to one plate of the feedback capacitor 96. The other plate of the capacitor 96 is connected to the output of the amplifier 92, indicated at 100. A third signal controllable switch 98 is connected in parallel with the resistor 94 and capacitor 96. Switch 98 is also controlled by the control signal $T_3$ provided by the sequencer 16 and when closed, the operational integrator 90 will reset. The switch 98, as well as switches 76 and 86, each may be any type of signal controllable switch, as for example, a FET. Generally, when the signal $T_3$ is applied, the switch 74 will be closed and switches 86 and 98 will be open. Conversely, when the signal $T_3$ is removed so as to turn off the ramp generator, the switch 74 will open so as to remove the input signal to the input of amplifier 80, and switches 86 and 98 will close so as to provide a short around the feedback path of each of the amplifiers 80 and 92. The output of the amplifier 92 will be a voltage with varies as a function of equation (1). The output of the amplifier 92 is applied to one input of multiplexer 100.

The ramp generator 20 also includes means for generating a linearly varying signal in accordance with equation (2), above. As shown the output of integrator 78 is applied through input resistor 102 to the input of inverting amplifier 104. The latter has a feedback resistor 106 and provides a signal in accordance with equation (2) during an interpulse interval. The output of the inverting amplifier 104 is connected to the other input of the multiplexer 100. The address control input, for selecting which ramping signal is provided at the output of the multiplexer, is provided with a ramp select signal provided by the sequencer 16, generally shown in FIG. 2.

The ramp generator 20 can also include an autozero circuit 108 for compensating for input offset voltages and input current to the amplifier 80 during the time between each comparison period when the switch 74 is open, and switches 86 and 98 are closed. Such autozero circuits are well known. For example, see U.S. Pat. No. 4,163,947 issued to Hans J. Weedon on Aug. 7, 1979, and assigned to the present assignee. As described in the latter patent, the operational integrators 78 and 90 integrate in the conventional manner during the time a comparison signal is generated, and a voltage is accumulated on each of the feedback capacitors 84 and 96. The operational integrator may be reset to discharge the capacitors 84 and 96 in preparation for a new integration between each successive comparison periods. During this reset mode, the operational integrators 78 and 90 automatically correct for input offset voltage errors in the amplifiers 80 and 92 by storing the offset voltage. During the autozero mode, a charge is stored on a capacitor (not shown) which provides via a buffer amplifier (not shown) a current which compensates for the current flowing into the input of the amplifier 80.

Referring again to FIG. 3, the output of each comparator 18 is connected to the input of a corresponding counter 22. The latter receives the clocking signal from the sequencer 16, generally shown in FIG. 2. A decoder 110 is utilized with each hybrid 40 (generally shown in FIG. 2) and is provided with a unique address identifying each hybrid. The decoder receives the address signal, referred to as the hybrid select signal, from the sequencer 16. The sequencer provides the hybrid select signal so that the hybrids are sequentially enabled so that the output of the hybrids can be sequentially read. A channel select signal is also received by the decoder 110 from the sequencer 16 so that the decoder sequentially enables each counter 22 of the corresponding hybrid so that the outputs of the counters of each hybrid can be sequentially read out of each counter. Thus, the outputs of the counters are sequentially read so as to provide a series of signals at the output of each hybrid circuit 40. The output of each circuit 40 is sequentially applied to the input of linearizer 24, the latter being generally shown in FIG. 1 and in greater detail in FIG. 2.

Referring to FIG. 2, linearizer 24 preferably includes a pair of multiplexers 120a and 120b, each having one input connected to receive the output of each hybrid circuit 40. The output of each hybrid circuit is also connected to the plus input of a signal subtractor 124, the latter having it output connected to the second input of the multiplexer 120b. The second input of the multiplexer 120a and the subtract input of the subtractor 124 are connected to receive corresponding output signals from memory 28. The address control signal for each multiplexer is provided by sequencer 16 so that the output of each multiplexer is connected to one of its inputs depending upon the address control signal provided by the sequencer. The output of each multiplexer is connected to an input of the digital signal multiplier 122. The latter multiplies values of the two signals applied at its inputs when provided with the appropriate signal from the sequencer 16 so as to provide a signal representative of the product of the two values. The output of the multiplier is applied to one input of the offset means 26, preferably in the form of a digital signal adder and subtractor. The signal adder and subtractor subtracts a signal provided from the memory 28, representative of the average interpulse value provided between X-ray pulses which can be predetermined and provided in the memory, from the value provided by the multiplier 122. The signal adder and subtractor shown as the offset means 26 is enabled by the sequencer 16.

The operation of the preferred system 10 will now be described with the aid of the timing diagram of FIG. 6 and the graphical illustration provided in FIG. 5. As each detector senses the pulsed X-rays, the typical signal provided to the input terminals 12a and 12b will resemble the signal shown in FIG. 6A. As shown the signal includes periodic pulses, I, with a predetermined interpulse value ($I_0$) between pulses. The magnitude of each pulse is proportional to the amount of X-ray flux sensed by the corresponding detector during the pulse period. Thus, as shown in FIG. 6A, the pulse $I(J+1)$ may be of a different magnitude than that of the previous pulse $I(J)$. As shown the period of each pulse is approximately 3 milliseconds, although the width of the pulse can vary depending upon the C.T. scan system with which the system 10 is used. For purposes of illustration the pulse collection time indicated at FIG. 6B for the pulse $I(J)$ is considered to commence at time $t_0$ and end at time $t_2$. As shown the pulse, $I(J)$ rises and falls substantially to the interpulse level within that time.

Thus, at time $t_0$, just prior to the beginning of the pulse $I(J)$ of the waveform shown in FIG. 6A at time $t_1$, a pulse is provided to each of the switches 58 and 66 of FIG. 3 so that both switches are closed and each circuit 50 and 52 is cleared. Similarly, while the switch 74 of the generator 20 remains open, the switches 86 and 98 of the generator are closed so that the operational integrator 78 and 90 are cleared by the time $t_1$. By $t_1$, the switch 58 is opened so that the capacitor 56 will charge in response to the input signal at the input terminals 12 of each channel. Switch 66 will be similarly opened prior to the commencement of the charge transfer time at time $t_2$, described hereinafter. Finally, the switches 86 and 98 will be opened prior to the pulse conversion time commencing at time $t_3$. During the pulse collection time between $t_0$ and $t_2$, capacitor 56 of each circuit 50 is charged by the input signal applied at the corresponding input terminals 12a and 12b. As shown in FIG. 6B the pulse collection time takes about 3 milliseconds, although the necessary time to collect the charge representative of the pulse may vary depending upon the speed of the C.T. scan system.

At the end of $t_2$ all of the charge will be collected on the corresponding capacitor 56 during the pulse collection interval between $t_0$ and $t_2$. Accordingly, the charge on the capacitor is transferred to the circuit 52 during the charge transfer time illustrated in FIG. 6D during the time between $t_2$ and $t_3$. During the charge transfer time each switch 58 is closed, and the charge on the capacitor 56 is applied to the input of the corresponding circuit 52. Since the switch 66 is opened prior to $t_2$, each circuit 52 will integrate the corresponding input signal and provide a voltage at its output representative of signal value appearing at its input. The pulse width of the pulse P(J) shown in FIG. 6D, is longer (between $t_4$ and $t_5$) than the slew rate of the circuit 52, i.e., 100 microseconds, so that the output of the circuit 52 will settle to its proper output value.

With the value of the output of the circuit 52 settled at $t_3$, the conversion time illustrated as the signal waveform in FIG. 6E will commence and continue until $t_4$. At $t_3$ the multiplexer 100 will be addressed so that the output of the ramp generator 20 will generate the voltage reference signal in accordance with equation (1) above. In addition, switch 74 will close so that the ramp signal generator 20 will begin generating the nonlinear reference signal. With switches 86 and 98 open, the two operational integrators 78 and 90 will double integrate the signal provided by the generator 70 so that the voltage represented by equation (1) above will be applied through the multiplexer 100 to each comparator 18 during the comparison period. During this time a comparison is made between the two signals applied to the two inputs of each comparator 18.

As the reference signal ramps between 0 and the maximum possible value of the analog signal provided at the output of each circuit 50, the counter 22 will be clocked at a rate such that the counter will receive a predetermined number of pulses during the comparison period. The predetermined number of pulses will equal the number of codes (i.e., possible digital values) used to represent the entire dynamic range of the analog signals. In the preferred embodiment, 16384 ($2^{14}$) different codes are used to represent the analog signal so that the counter will be clocked 16384 times during each comparison period. As shown each comparison period is shown to last about 1 millisecond. The value of the reference signal at the time each pulse is applied to each counter 22 will be such that the reference signal will ramp through all of the digitization intervals of the code at the time the respective pulses are applied to each of the counters.

As the ramp signal varies at one input the other input of the comparator remains substantially constant so that theoretically the output of the comparator will remain substantially at one binary level, e.g., at a 0 binary state, so long the ramp signal is less than the input received from the amplifier 60 of the corresponding circuit 52, and at the other binary level, e.g., at a 1 binary state, when the ramp signal equals or exceeds the input signal received from the circuit 52. However, since the output of each circuit 52 may contain certain electronic noise as the ramp signal is applied, there may be some error introduced due to the variation in the signal. However, since the output of the comparator is applied to a counter, which is clocked at a rate so the number of clocking pulses provided to the counter during this comparison period will equal the number of codes possible for the digital conversion, the uncertainty attributed to the electronic noise will tend to average out.

Figure 5:
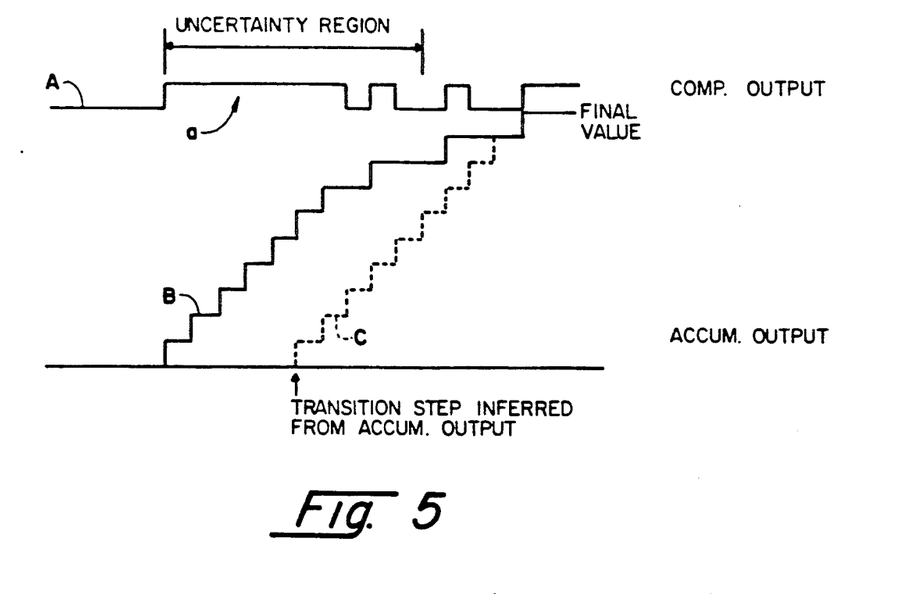
FIG. 5 is a graphical representation for illustrating the averaging technique for reducing comparator uncertainty and, therefore, certain electronic noise.
Figure 6:
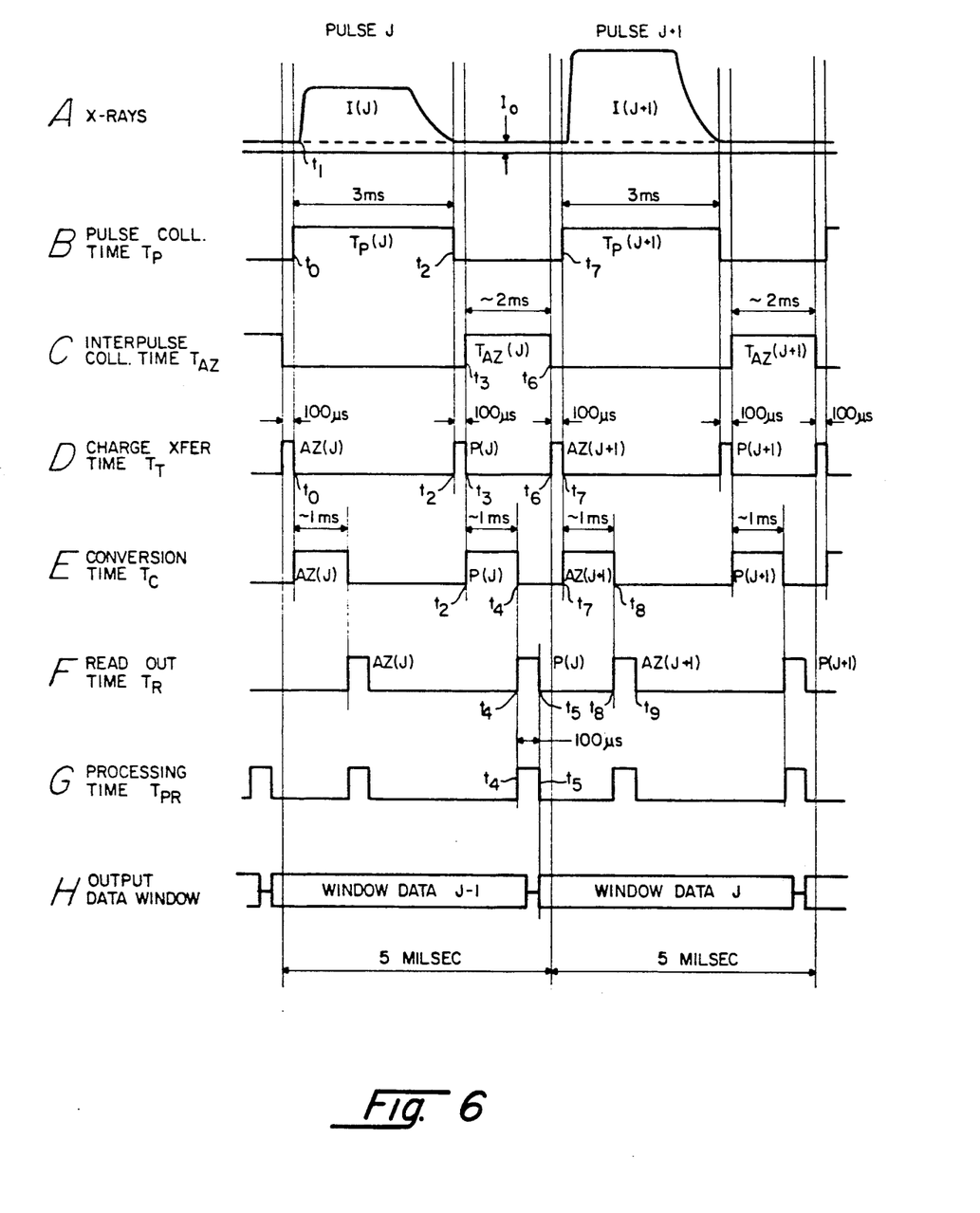

The foregoing will be more evident as shown in FIG. 5, wherein the curve A shows a typical comparator output where the output is at a zero state during each clocking interval until the ramp signal approaches the level of the other input to the comparator. As the reference signal ramps through the level close to the signal level at the other input of the comparator the signal output of the comparator may change between the binary 1 and 0 states several times as indicated by the portion a of the curve A, before settling on the binary 1 state. In the example given by curve A, the accumulated count provided to the corresponding counter 22 will equal the curve B and will resemble the curve C. As shown, curves B and C eventually merge so that the technique provides an average of the uncertainty provided by the comparator.

Referring to FIG. 6F, at $t_4$ the comparison period ends and the sequencer 16 will begin to read out the accumulated values stored in each counter 22 and the signals will be processed by the linearizer 24 as indicated in FIG. 6G. As shown in FIG. 2 the multiplexers 120a and 120b will be addressed so that each of the outputs of the counters of the hybrid circuit will be transmitted through an input of each of the multiplexers 120, and the signal will be multiplied by itself by the signal multiplier 122. Since the coded value represents the square root of the original value, the output of the multiplier will be the value of the linearized signal. The offset attributed to the previously measured interpulse values, determined during the previous interpulse periods (as will be described hereinafter) and thus representative of the average value of $I_o$ in FIG. 6A will be subtracted from the linearized signal and difference will be transmitted to memory 28 and stored for subsequent transmission and/or transmitted out of the memory 28. The processing time ends at $t_5$ (see FIG. 6G) and the system next updates the average value of the interpulse values $I_o$. In determining the average interpulse value the linearizer functions to determine the average value of $I_o$ in accordance with the following well known averaging equation (3):

$$(x_{j+1} - A_j)/k + A_j = A_{j+1}; \quad (3)$$

wherein $x_{j+1}$ is the new interpulse value of $I_o$ to be averaged;

$A_j$ is the last determined value of the average of the interpulse values;

k is the total number of interpulse values taken; and $A_{j+1}$ is the new average value.

In order to measure the value of $I_o$ between each successive pulse, such as $I(J)$ and $I(J+1)$, the switch 58 of each circuit 50 will be open at time $t_3$. As shown in FIG. 6C, the capacitor 56 charges in response to the signal applied to the input terminals 12 during the time between $t_3$ and $t_6$ which will be the interpulse signal $I_o$. Since the comparison period for the pulse $I(J)$ ends at $t_5$, the capacitors 64 (FIG. 3) and 84 can be cleared by closing the respective switches 66 and 86 with pulses provided by sequencer 16 of FIG. 1. By the time $t_6$ the switches 66 and 86 are open so that the interpulse signal collected during the interval, defined by the time between $t_3$ and $t_6$, can be processed. As shown in FIG. 6C, the interpulse collection time is less than the pulse collection time shown in FIG. 6B, e.g., two milliseconds, since the interpulse signal level will usually be much less than the peak level of each pulse. Between $t_6$ and $t_7$ switch 58 is closed and the charge provided on capacitor 56 of each channel is transferred to the input of the corresponding circuit 52. The latter converts the charge to a voltage which is applied to the input of the corresponding comparator 18. The signal output of each circuit 52 at the time $t_7$ can now be converted to a digital signal. The conversion is performed during the conversion time between $t_7$ and $t_8$. During this signal processing interval, the multiplexer 100 is addressed so that the output of the amplifier 104 (in accordance with equation (2) above) is provided at the output of the multiplexer. This linearly varying signal is applied to the other input of each of the comparators 18 during the comparison period since the dynamic range of the interpulse value is much less than the dynamic range of the pulses. The signal output of each circuit 52 at time $t_7$ will be digitized as a function of the linear varying reference signal during the conversion time. The signal can be encoded, for example, with $2^{14}$ different codes, although this can vary.

When the outputs of the counters 16 are sequentially applied to linearizer 24 during the interpulse processing period, the latter is programmed to function as the signal averager in accordance with equation (3) so that an offset value can be generated. More specifically, when the first interpulse value is read, the value of $A_j$ of the offset table within memory 28 will be set to zero, and $k=1$. During the processing time interval that the first interpulse value is provided, the first value of the interpulse value $I_o$ will be the $x_j$ portion of equation (3) above, and applied at the output of each counter 16 to the positive input of the subtractor 124. The output of the memory 28 that is applied to the negative input of the subtractor 124, representative of the current value of $A_j$, is initially zero. The output of the memory applied to the input of multiplexer 120a equals 1/k so that the initial output will equal 1. During this processing interval the multiplexer 120a is addressed so that the 1/k signal is applied to one input of the multiplier 122, while multiplexer 120b is addressed so that the output of the subtractor 124 is applied to the other input of the multiplier 122. The resulting value is added to $A_j$(zero) by the adder 26. Thus, the value of $A_{j+1}$ will equal $x_j$, or the output of each counter 16 representative of the first interpulse portion signal in each channel. This value is stored as the present offset value and is subtracted from the first value of the pulse, e.g., I(J), provided during the signal processing time, as for example, represented between time $t_4$ and $t_5$.

During subsequent processing intervals between successive pulses, the value of $A_{j+1}$ is updated and stored in memory 28. For example, if the processing time shown between $t_8$ and $t_9$ represents the fifth time the offset value is updated, i.e., $k=5$, the value provided by memory 28 to the input of the multiplexer 120a will be 1/5. The value of $A_j$ stored in memory following the previous processing interval for calculating the offset (when $k=4$), is provided at the negative input of the subtractor 124 and subtracted from the signal representative of the current value of the pedestal provided by the memory 28 and provided at the negative input of the subtractor 124. The output of the multiplier 122 will equal the new interpulse value provided at the positive input of the subtractor 124 ($x_{j+1}$) minus the last value of the average pedestal value ($A_j$). The term provided at the output of the subtractor will be multiplied by the factor 1/k provided by memory 28 to the input of memory 28. The output of multiplier 122 will therefore equal the term $(x_{j+1} - A_j)/5$, since $k=5$. The value of $A_j$ is also applied to the offset means 26 where it is subtracted from the term consistent with equation (3) so as to generate the new value of $A_{j+1}$. The new value is provided to the memory 28 where the offset table is updated with the new average value of $I_o$.

Figure 7:
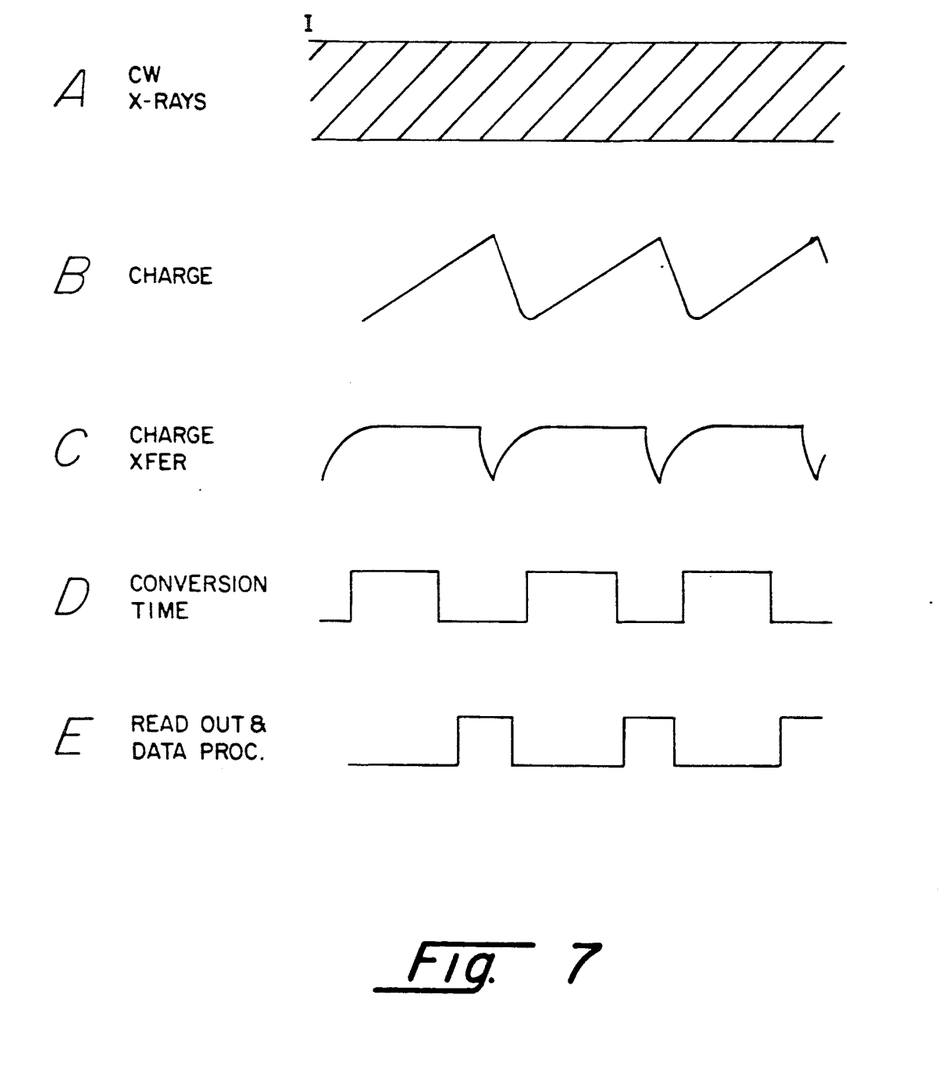

While the system is described for use with pulsed X-ray sources, the device can easily be adapted for system using CW X-ray sources. The system would be constructed identically, except that the offset means 26 is not needed. Accordingly, the latter can be omitted, or made ineffective by providing an offset value of zero each time the offset value is to be subtracted from the processed value of the analog signals. Thus, the output of the multiplier 122 effectively would be directly connected to the memory 28. As shown in the timing diagram of FIG. 7, with each switch 58 opened, each capacitor 56 is allowed to charge to a level where the charge represents the value of the input signal (see FIG. 7B). The switch 58 is then closed so that the charge stored in each capacitor 56 is transfered to the circuit 52 as illustrated by FIG. 7C. Circuit 52 will convert the charge to a voltage and hold the voltage to one input of the corresponding comparator 18. The nonlinear ramp signal defined by equation (1) above is then applied to the other input of each comparator during each comparison interval as illustrated by FIG. 7D, so as to provide the appropriate count to the respective counter 22. The data can be subsequently processed by the multiplier 122 and stored in memory 28 as suggested in FIG. 7E.

The system thus described provides a data acquisition system having several advantages. By using a ramp signal in the preferred embodiment which varies as a square function of time between the minimum and maximum possible values of the input signal, the system will operate consistently with the teachings of U.S. Pat. No. 4,569,028. As a result the system thus provided is an adaptive digitizing data acquisition system which utilizes a minimum number of bits required to properly code the information content of the signal while preserving the desired linear dynamic range for representing image information. Thus, the system can convert analog information signals to digital signals each having a linear dynamic range of the order of 20 bits or more. In addition, the system simultaneously and synchronously converts a plurality of analog signals to digital signals during each reading reducing the number of uniformity and design constraints of multiple A/D converter systems. The data acquisition system can easily be adapted for use with either pulse X-ray or continuous wave X-ray sources.

As a result an improved A/D converter system is provided for use in a C.T. scan system including a source of pulsed X-rays, for simultaneously generating a plurality of analog signals representative of detected X-ray radiation, and synchronously reading the output of all of the detectors so as to substantially avoid artifacts due to a variable afterglow reading of X-ray pulses. The A/D converter system is easily adapted for use in a C.T. scan system and is capable of providing in excess of 500 views/second, independent of the number of channels. Finally, by using counters 22 the system is capable of averaging certain electronic noise attributed to drift at the outputs of the comparators 18.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A data acquisition system for converting a plurality of analog information signals to a corresponding plurality of digital output signals each (a) having a dynamic range of n bits to match the dynamic range of the corresponding analog information signal and (b) representative of the corresponding analog information signal during each of a plurality of time intervals, said system comprising:

means for simultaneously converting each of said analog signals to an intermediate digital signal during each of said time intervals in accordance with a digitization code of m bits, wherein the total number of bits represented by m is less than the total number of bits represented by n, such that the digitization intervals of the code increase non-linearly so that the ratio of the noise level of the intermediate digital signal and the digitization interval of the code is substantially constant throughout the dynamic range of said analog signals; and means for transforming each of said intermediate signals to a corresponding value of said digital output signals.

2. A system according to claim 1, wherein each of said time intervals includes a predetermined number of comparison intervals equal to $2^m$, and said means for simultaneously converting each of said analog signals to an intermediate digital signal includes means for generating a reference signal as a nonlinear function of time such that the amplitude of said reference signal equals each of said digitization intervals at the corresponding ends of the plurality of comparison intervals, and means for comparing each of said analog signals at the end of each of said comparison intervals.

3. A system according to claim 2, wherein said analog information signals represent the magnitude of X-ray flux, and said means for generating said reference signal generates said reference signal as a function of the square of time so that the amplitude of said reference signal increases by a function of the square root of the amplitude at the end of each of said comparison intervals.

4. A system according to claim 3, wherein said analog information signals each represent the magnitude of pulsed X-ray flux such that each of said analog signals includes periodic pulses, each of said pulses occuring during a respective time interval, and an interpulse value between each pair of successive pulses, and further including means for converting each of said interpulse values to a digital signal so as to represent the interpulse value of said analog signal, and means for subtracting the average value of the previous ones of said interpulse values of said analog signals from the next consecutive corresponding pulse value of said analog signals.

5. A system according to claim 2, wherein said means for simultaneously converting each of said analog signals to an intermediate digital signal includes means for integrating said analog signal during each of said time intervals so as to provide an average signal representative of the value of each said analog signal during each of said time intervals, and means, responsive to said average signal, for comparing said average signal with said reference signal at the end of each of said comparison intervals.

6. A system according to claim 5, wherein said means for simultaneously converting each of said analog signals to an intermediate digital signal includes switching means for transferring and holding each of said average signals.

7. A system according to claim 2, further including counter means for accumulating a count of the number of times said reference signal exceeds each of said analog signals at the end of each of said comparison intervals during said time interval so as to represent the digital value of said intermediate digital signal.

8. A data acquisition system for converting a plurality of analog information signals to a plurality of digital signals representative of the analog information signals during each of a plurality of time intervals, said system comprising:

signal averaging means for averaging each of said analog signals during each of said time intervals so as to produce a corresponding average signal representative of the average value of the analog signal during each said time interval;

signal generating means for generating a comparison signal during a signal comparison period of time during each of said time intervals, wherein said comparison period includes a plurality of clocking intervals equal to the number of unique digitization intervals of a predetermined digitization code, and the comparison signal varies with time during each signal comparison period so that the values of said comparison signal at the ends of the corresponding comparison intervals throughout the comparison period (i) vary as a nonlinear function of time and (ii) represent the possible number of digitization intervals of said digitization code;

signal comparison means, coupled to the output of said signal averaging means and said signal generation means, for synchronously comparing each of said average signals with said comparison signal at the end of each of said comparison intervals during said comparison period; and means, responsive to said signal comparison means, for providing a plurality of encoded digital signals respectively representative of the number of clocking intervals the value of each average signal exceeds the comparison signal during the comparison period, wherein each of the encoded digital signals digitally represents the corresponding value of an average signal in accordance with said digitization code;

wherein said means for providing a plurality of encoded digital signals includes means for maintaining the ratio of the noise level of the encoded digital signal and the digitization interval is substantially constant throughout the dynamic range of the encoded digital signal.

9. A system according to claim 8, wherein signal averaging means for averaging each of said analog signals includes a signal integrator for integrating each of said analog signals during each of said time intervals so as to produce said corresponding average signal.

10. A system according to claim 8, wherein said signal generating means includes a ramp generator for generating a ramp signal which varies as a function of $k_1 t^2$, wherein $k_1$ is a constant and t is the time elapsed of said comparison period.

11. A system according to claim 9, wherein each of said analog signals includes a plurality of successive pulse values and interpulse values between each pair of successive pulse values, said signal averaging means averages each of said pulse values and said interpulse values of each of said analog signals during respective time intervals so as to produce a corresponding average signal representative of the average value of each of said pulse values and said interpulse values, and said ramp generator also generates a ramp signal which varies as a function of $k_2 t$, wherein $k_2$ is a constant and t is the time elapsed of said comparison period when said interpulse is compared with said comparison signal.

12. An analog to digital converter for converting an analog signal to a digital signal during each of a plurality of predetermined conversion intervals of time, said converter comprising:

integrating means for integrating said analog signal during each conversion interval of time so as to provide an integrated signal;

signal generation means for generating a comparison signal having a value that varies as a function of the square of time during a comparison period of time for each of said conversion intervals of time;

signal comparison means, coupled to the output of said integrating means, for comparing the value of said integrated signal with the value of said comparison signal for each of a lity of clocking intervals during said comparison period; and means, responsive to said signal comparison means, for generating said digital signal for each said conversion interval as a function of the number of clocking intervals the value of said analog signal exceeds said comparison signal during said comparison period.

* * * * *

UNITED STATES PATENT AND TRADEMARK OFFICE
CERTIFICATE OF CORRECTION

PATENT NO. : 5,138,552

DATED : August 11, 1992

INVENTOR(S) : Hans J. Weedon and Enrico Dolazza

It is certified that error appears in the above-identified patent and that said Letters Patent is hereby corrected as shown below:

Claim 8, column 17, line 44, delete "is"; and

Claim 12, column 18, line 38, delete "lity" and substitute therefor --plurality--.

Signed and Sealed this

Twelfth Day of October, 1993

Attest:

BRUCE LEHMAN

Attesting Officer     Commissioner of Patents and Trademarks